(12) United States Patent
Jiang

(10) Patent No.: US 11,919,091 B2
(45) Date of Patent: Mar. 5, 2024

(54) NANOSTRUCTURED METALLIC LAYER ON CARBIDE FOR IMPROVED COATING ADHESION

(71) Applicant: P&S Global Holdings LLC, Houston, TX (US)

(72) Inventor: Wenping Jiang, Fayetteville, AR (US)

(73) Assignee: P & S Global Holdings LLC, Houston, TX (US)

( * ) Notice: Subject to any disclaimer, the term of this patent is extended or adjusted under 35 U.S.C. 154(b) by 939 days.

(21) Appl. No.: 16/849,405

(22) Filed: Apr. 15, 2020

(65) Prior Publication Data

US 2020/0238390 A1   Jul. 30, 2020

Related U.S. Application Data

(63) Continuation-in-part of application No. 15/443,887, filed on Feb. 27, 2017, now Pat. No. 11,267,053.

(60) Provisional application No. 62/300,634, filed on Feb. 26, 2016.

(51) Int. Cl.
| | |
|---|---|
| *B32B 27/14* | (2006.01) |
| *B23B 27/14* | (2006.01) |
| *C23C 16/32* | (2006.01) |
| *C23C 16/34* | (2006.01) |
| *C23C 16/36* | (2006.01) |
| *C23C 16/40* | (2006.01) |
| *C23C 28/00* | (2006.01) |
| *B82Y 30/00* | (2011.01) |

(52) U.S. Cl.
CPC ............ *B23B 27/148* (2013.01); *C23C 16/32* (2013.01); *C23C 16/34* (2013.01); *C23C 16/36* (2013.01); *C23C 16/403* (2013.01); *C23C 28/347* (2013.01); *B23B 2224/04* (2013.01); *B23B 2224/28* (2013.01); *B23B 2224/32* (2013.01); *B23B 2224/36* (2013.01); *B23B 2228/04* (2013.01); *B23B 2228/12* (2013.01); *B23B 2228/44* (2013.01); *B82Y 30/00* (2013.01)

(58) Field of Classification Search
CPC .............. B23B 27/148; B23B 2224/04; B23B 2224/28; B23B 2224/32; B23B 2224/36; B23B 2228/04; C23C 16/32; C23C 16/34; C23C 16/36; C23C 16/403; C23C 28/347; C23C 28/044; C23C 28/30; C23C 28/32; B82Y 30/00
See application file for complete search history.

*Primary Examiner* — Laura A Auer
(74) *Attorney, Agent, or Firm* — Kean Miller LLP; Robert Devin Ricci; Brian J. Servé

(57) ABSTRACT

A coating for carbide substrates employs a nanostructured coating in conjunction with a non-nanostructured coating. The nanostructured coating is produced by the addition of a refining agent flow, particular hydrogen chloride gas, during deposition, and may be produced as multiple individual titanium and titanium-based nanostructured layers varying functional materials in a series. The combination of a nanostructured coating and non-nanostructured coating is believed to produce a cutting tool insert that exhibits longer life. Pre-treating the substrate with a mixture of compressed air and abrasive medium prior to coating the substrate and post-treating the coated substrate with a mixture of water and abrasive medium after the coating process is believed to further enhance the wear resistance and usage life of the cutting tool.

21 Claims, 7 Drawing Sheets

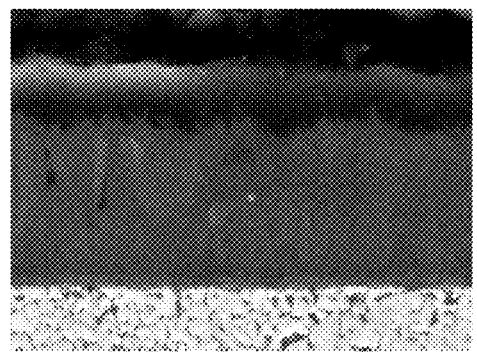
FIG. 10
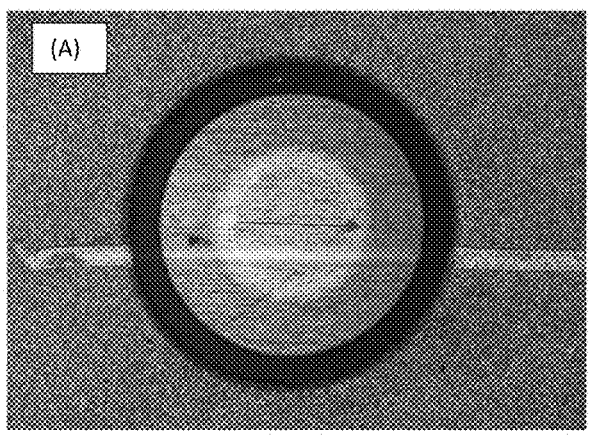 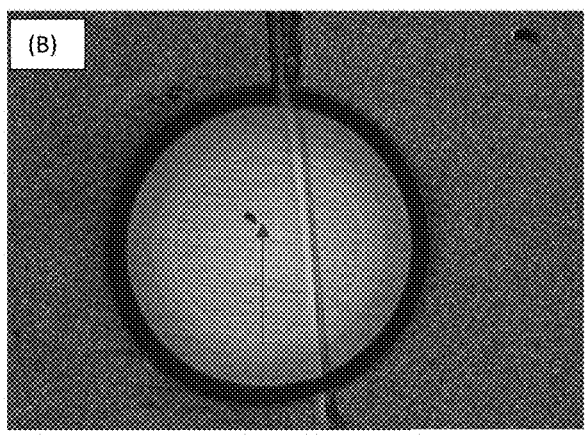
FIG. 11a  FIG. 11b

NANOSTRUCTURED METALLIC LAYER ON CARBIDE FOR IMPROVED COATING ADHESION

CROSS REFERENCE TO RELATED APPLICATION

This application is a continuation-in-part of U.S. patent application Ser. No. 15/443,887 filed on Feb. 27, 2017, and entitled "Nanostructured Coated Substances For Use in Cutting Tool Applications", which claims priority from U.S. provisional patent application No. 62/300,634, filed Feb. 26, 2016, and entitled "Coated Carbide Cutting Tools." Such applications are incorporated by reference in their entireties.

STATEMENT REGARDING FEDERALLY SPONSORED RESEARCH OR DEVELOPMENT

Not applicable.

REFERENCE TO A "SEQUENCE LISTING", A TABLE, OR COMPUTER PROGRAM

None

DESCRIPTION OF THE DRAWINGS

FIG. 10 is an SEM photograph showing the cross-section of the configuration displayed in FIG. 9.

FIG. 11A is an optical image showing the coating with a titanium layer in a first sample comparison.

FIG. 11B is an optical image showing the coating without a titanium layer in a first sample comparison.

FIELD OF THE INVENTION

Figure 1:
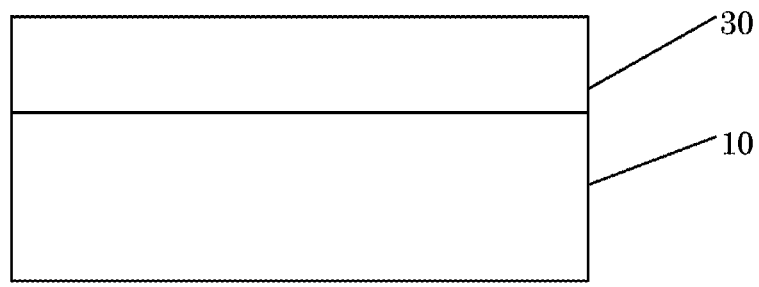
FIG. 1 is an illustration of one embodiment of the present invention, showing a coated substrate having a nanostructured coating comprising a single nanostructured layer deposited over the substrate.

The present invention relates to the general field of metallurgy, especially as it relates to producing an improved cutting tool. In particular, the invention relates to a series of nanostructured layers of titanium and titanium based materials on a substrate, forming a hard and resilient tool. A properly coated substrate according to the present invention is shown to improve performance by decreasing wear and coating delamination and increasing the performance life of the tool.

BACKGROUND OF THE INVENTION

Coatings are effective for improving the performance of various materials, such as for achieving better wear resistance and corrosion resistance. Common applications where a coating is applied to a substrate to improve wear resistance of the substrate material include cutting tool inserts for the cutting of hard materials, such as hardened steel with interruptions, and the machining of heat-resistant alloys. Common substrate materials for cutting tools may include, for example, hard metals of different particle sizes with a varied percentage of cobalt or nickel as a binder material. Wear on the coatings of cutting tool inserts is a well-recognized problem, particularly in connection with certain difficult cutting applications.

One such application is the cutting of hard metals with severe interruptions. Coatings applied to carbide substrates produced using chemical vapor deposition (CVD) processes, a common technique, may be chipped off, resulting in premature failure of the cutting tool insert, or exhibit excessive flank wear, again leading to poor performance for the cutting tool insert. Multiple-layer coatings have been developed for cutting tool inserts as attempts to solve this problem. Nevertheless, improved performance is still desired in order to increase the wear life of cutting tool inserts, particular those used with particularly difficult applications, such as the cutting of hardened steel with interruptions.

Another application that presents significant challenges is the machining of heat-resistant alloys. Such applications impose challenges including excessive heat generation at the tool-workpiece interface, workpiece hardening, and expedited tool wear including notch wear. Because of these challenges, machining of heat resistant alloys has generally been limited to relatively low material removal rate (i.e. low surface speed and feed rate). Advances including tool material formulation development, chip breaker design, edge honing, and coating formulation have been made to address these challenges, but problems still remain.

Standard C2 (i.e., soft) carbide grade materials with up sharp edge (i.e., no edge preparation after grinding) in uncoated form have been used for machining heat-resistant alloys. The inventor hereof has recognized that to meet the challenges associated with machining of heat-resistant alloys, an outer adherent coating layer on carbides with submicron and micron sized tungsten carbide (WC) grains, coupled with 5.0-12% cobalt (Co) binder, is necessary, as this combination can provide thermal management for reducing thermal deformation and degradation. The combination can also provide balanced hardness and toughness and resistance to notch wear. In terms of edge preparation, up sharp edge on many carbide tools provides the needed edge for shearing the materials, and thus reduces the heat generation at the tool-workpiece interface due to relatively low pressure at the interface. Up sharp edge also helps to defer the initiation of notch formation on the leading side of the cutting edges. However, the up sharp edge tends to chip or break due to unstable machining settings, including machine setup rigidity, interruptions, or out-of-roundness on workpieces. The chipped edge, in turn, increases cutting forces and therefore increases heat. This causes further degradation of workpiece surface finishes.

One option for ceramic materials, polycrystalline boron nitride-based cutting tools, and some carbide inserts, is the application of a T-land or K-land on the cutting edge to prevent edges from microchipping. The cutting edge is thus ground to a relatively flat surface from its original curved point that would result from a radius hone. While this provides the necessary edge protection, it typically results in significant heat generation, which further degrades workpiece surface finishes. Thus, a proper edge hone that can protecting the cutting edge from chipping, while providing the needed sharpness for shearing the workpiece materials, is critical for machining heat resistant materials. Furthermore, adherent coatings on cutting tool materials have substantially increased the productivity of machining. Coated tools typically run at a much higher surface speed and feed rate than their counterpart uncoated tools. Due to high heat generation involved in heat-resistant alloy machining, proper coating chemistry, coating thickness, and structure is critical.

BRIEF SUMMARY OF THE INVENTION

The present invention is directed to a nanostructured adherent coating on a substrate for enhancing the wear resistance performance of the substrate. Whereas the nanostructured coating could be a single nanostructured layer of functional particles, it has been found that configurations of nanostructured layers comprising multiple sub-layers each comprising functional particles coupled with other layers and treatments result in an improved product. As disclosed herein, the term nanostructure is defined in relationship to grain size. As disclosed herein, the particular nanostructured layers also tend to be relatively thin. That said, structure (nano or non-nano) and thickness are herein viewed as separate characteristics of the layers. A coating according to the present invention shows improved hardness and toughness, which reduces edge chip-off and flank wear, particularly in difficult applications such as machining hardened steel with interruptions or machining of heat-resistant alloys. The surface processing and treatment allows manipulation of stress and related properties, which in turn further extends the performance of the substrate in various applications.

In a first aspect, the invention is directed to a cutting tool insert, comprising a coated substrate with nanostructured titanium containing layers deposited over the substrate. As discussed herein, a "coating" may (or may not) have multiple layers. The nanostructured coating layer may be configured as a single layer comprising a number of functional particles (for example, FIG. 1) or as a series of sub-layers each comprising a number of functional particles (for example, FIG. 2). In the most preferred embodiment, the first titanium containing layer 11 comprises a layer of relatively pure titanium (Ti), followed by the application of additional nanostructured and non-nanostructured layers (for example FIG. 9). As disclosed herein, nanostructured-to-nanostructured interface significantly increases contact area and further improves coating adhesion between coating layers. In yet another embodiment, the substrate may be pre-treated prior to coating the substrate coated with the coating layer(s) and post-treated after the coating process to further enhance the wear resistant capabilities of the cutting tool insert.

DETAILED DESCRIPTION OF THE INVENTION

With reference to FIG. 1, one embodiment of the present invention for use in connection with a cutting tool insert may be described. A substrate 10 forms a base for the tool insert. The substrate 10 is preferably selected from carbide or ceramic based substrates, and may be, for example, formed of cemented carbide or hard metals. Substrate 10 preferably comprises a grain size in the sub-micron and micron range of 0.1 to 1.5 microns and more preferably comprises an average grain size in the range of 0.4 to 0.8 microns. For example, substrate 10 may be a carbide substrate with tungsten carbide (WC) grain size in the range of sub-microns to microns range. For purposes herein, a sub-micron grain size means that the average size of grains is less than 1 μm in diameter in any direction but greater than nano-sized (i.e., greater than 100 nm in diameter in any direction), while a micron grain size means that the average size of grains is equal to or greater than 1 μm in any direction.

Substrate 10 is comprised of a carbide. It is preferred that substrate 10 comprises about 5.0 to 15.0 weight percent of cobalt or nickel as a binder. For example, the substrate may be a carbide substrate having a carbide matrix with submicron and micron sized tungsten carbide grains and a metallic binder phase comprising cobalt in the range of 5 to 12 percent. The substrate of the preferred embodiment has an edge hone in the range of about 0.0005" to 0.002." The substrate also preferably has an edge honing of less than 35 microns, and more preferably between 8 and 20 microns. Finally, the substrate preferably has a hardness in the range of about 90 to about 93 HRA.

Substrate 10 may be pre-treated according to the method described below with a mixture of compressed dry air and a pre-treatment abrasive medium with particle size ranging from 10 to 150 microns, and more preferably from 30-80 microns. A suitable pre-treatment abrasive medium may include oxides and carbides, with the preferred abrasive medium being aluminum oxide. The pressure of the mixture may be in the range of 0.5 bar to 7.0 bar and is preferably from 1.0 bar to 3.5 bars. The following are non-limiting examples of substrates that may be used according to the present invention:

Substrate Example 1

A hard metal substrate having grain size between 0.1 to 1.5 micron and more preferably 0.4 to 0.8 micron average grain size. The substrate comprises a cobalt content (weight percentage) of 5 to 8 percent. The substrate also comprises a hardness of 91.8-93.3 HRA, a minimum transverse rupture strength of 275 ksi, a magnetic saturation of 110-150 emu/gram with grain growth inhibitors no more than 0.65%.

Substrate Example 2

A hard metal substrate having grain size between 0.1 to 1.5 micron and more preferably 0.4 to 0.8 micron average grain size. The substrate comprises a cobalt content (weight percentage) of 9 to 12 percent. The substrate also comprises a hardness of 91.0-92.8 HRA, a minimum transverse rupture strength of 350 ksi, a magnetic saturation of 110-150 emu/gram with grain growth inhibitors no more than 0.75%.

As indicated above, in one embodiment, a pre-treatment is applied to substrate 10 prior to depositing the coating layers onto substrate 10. The pre-treatment may, for example, comprise a mixture of compressed air and pre-treatment abrasive medium having particle size in the range of 10 to 150 micron and more preferably in the range of 30 to 80 micron. The pre-treatment abrasive medium may include oxides and carbides and is preferably aluminum oxide. The pre-treated substrate may then be coated with the layers as described herein.

Figure 2:
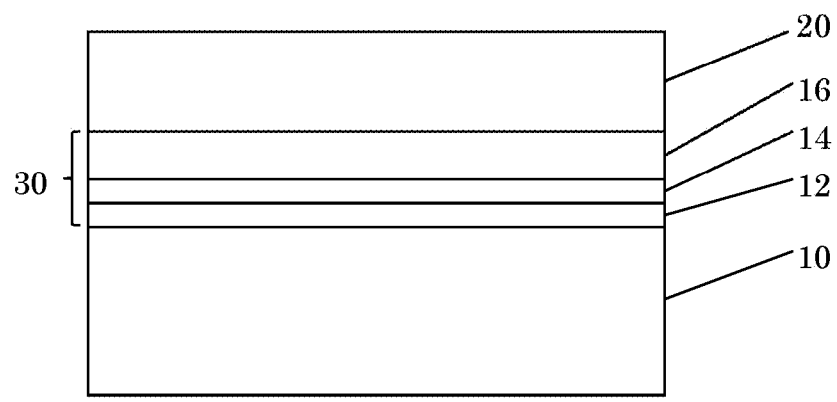
FIG. 2 is an illustration of one embodiment of the present invention, showing a coated substrate having a nanostructured coating comprising a number of nanostructured layers deposited over the substrate and having an optional non-nanostructured layer deposited over the nanostructured layer.
Figure 3:
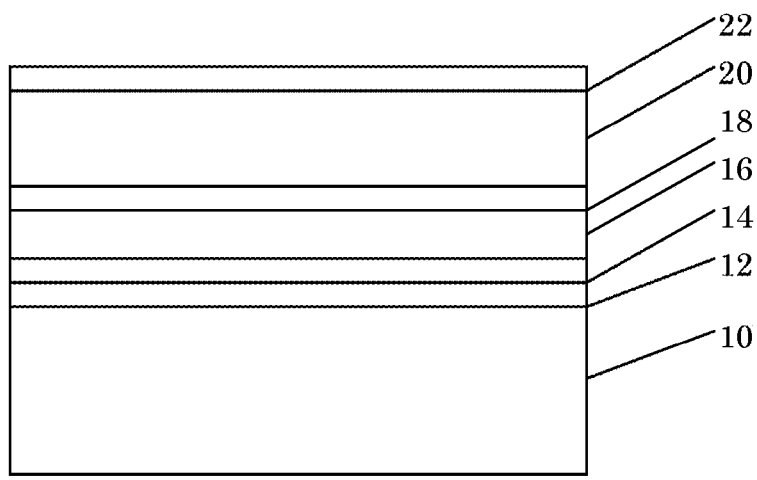
FIG. 3 is an illustration of one embodiment of the present invention, showing a coated substrate having a nanostructured coating comprising a number of nano-structured layers and having a number of additional optional layers deposited on the substrate.
Figure 4:
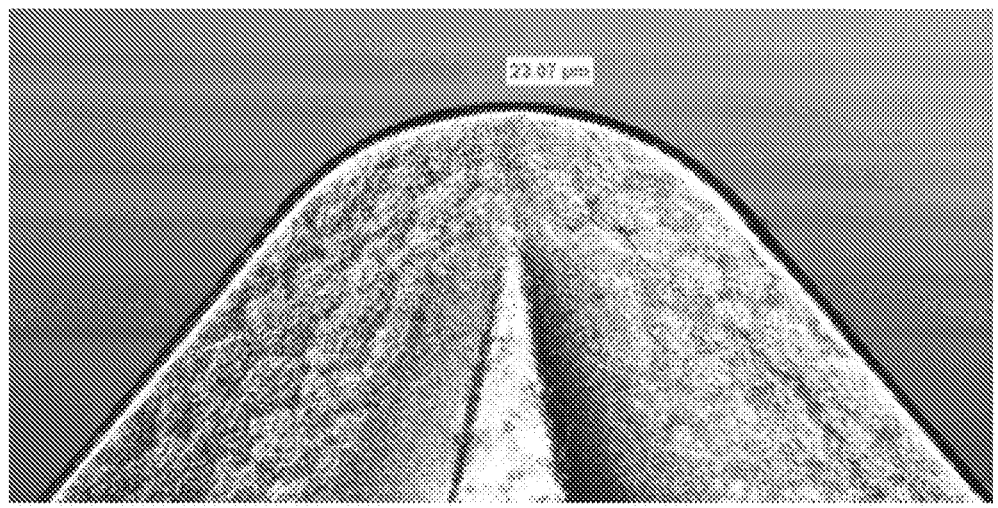
FIG. 4 is a photograph showing one embodiment of the present invention having a carbide insert with edge honing of 23 μm.
Figure 5:
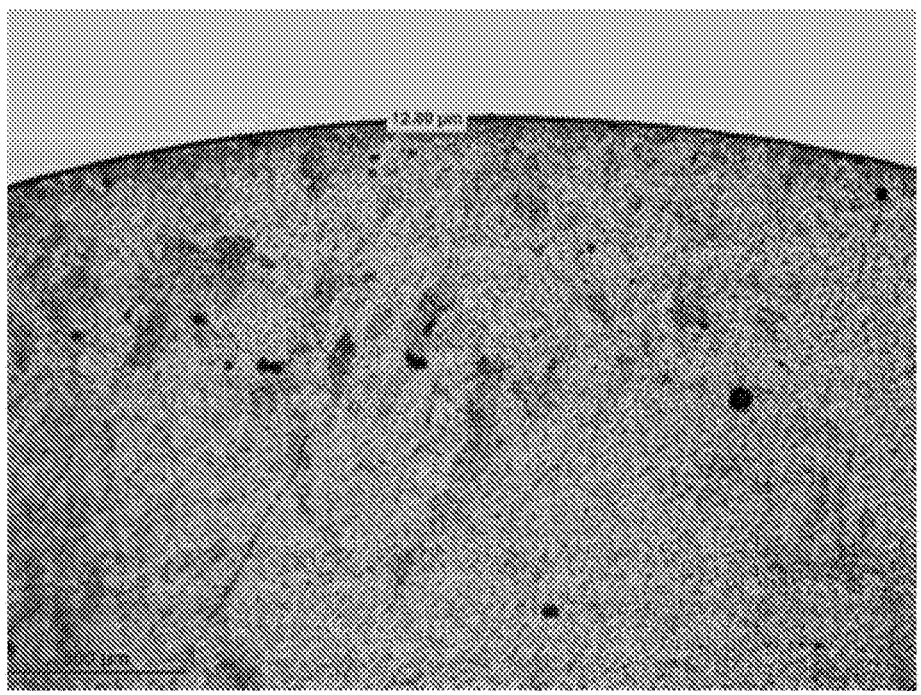
FIG. 5 is a photograph showing one embodiment of the present invention having a carbide insert with edge honing of about 12 μm.

The substrate 10 of the cutting tool insert of the present invention is coated with a nanostructured coating 30 deposited over substrate 10 preferably by a chemical vapor deposition (CVD) process according to the method described herein. Nanostructured coating 30 may be a single coating layer (as shown in FIG. 1) comprising a number of different functional particles or may be a series of sub-layers (as shown in FIGS. 2 and 3) with each layer comprising one or more functional materials. For example, in one embodiment, coating 30 is a single nanostructured coating layer comprising titanium nitride (TiN), titanium carbonitride (TiCN), aluminum oxide (a-$Al_2O_3$), titanium carbide (TiC), and titanium nitride (TiN) (FIG. 1), while in another embodiment, the nanostructured coating 30 may comprise multiple nanostructured layers: a first nanostructured layer 12 having TiN, a second nanostructured layer 14 having TiCN, and a third nanostructured layer 16 having TiCN (as shown in FIG. 2). Multi-layer tools described herein demonstrates improved performance over the prior art. This improved performance does not materialize merely because there are multiple layers but because of the combination of specific layers with specific qualities and the resulting interfaces.

In another embodiment, a layer of relatively pure (>95%) titanium 11 with thickness of 5 to 150 nm, more specifically, 20 to 80 nm, is first deposited on substrate of carbides (FIG. 9/FIG. 10) using CVD method. This thin layer of titanium may be nanostructured or non-nanostructured as defined herein. In at least one embodiment, the titanium layer is nanostructured. Following the layer of Ti 11, sequential layers of nanostructured TiN, nanostructured TiCN-1, nanostructured TiCN-2, and a carbon enriched intermediate layer, $Al_2O_3$ layer, and a TiN capping layer are deposited by the use of chemical vapor deposition method.

The specific functions of the titanium layer 11 are (A) to enhance the wettability of the substrate surface to promote overall coating adhesion to the substrate; (B) to seal the surface of substrates to avoid Co loss or depletion (in majority of the cases, Co is a metallic binder for the substrate and one of the important factors affecting the overall toughness of the coated carbides); and, (C) formation of Ti compositional gradient layer to reduce potential tensile stress buildup at the interface between the substrate and the coating layer.

Figures 7A, 7B:
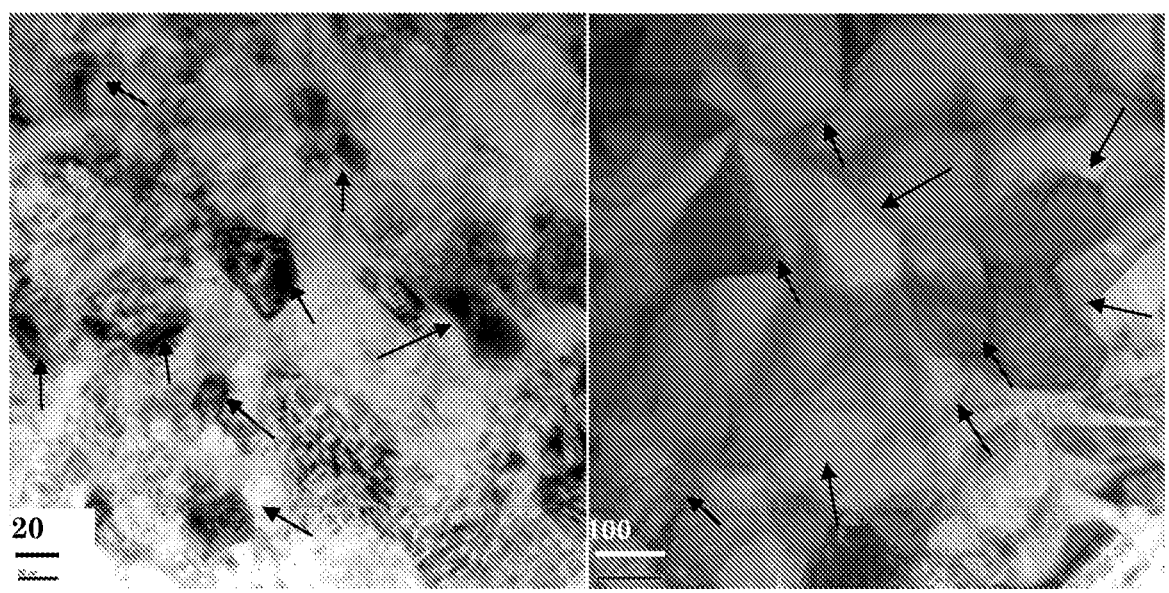
FIG. 7A is an SEM photograph top planar view of a cross-section of a nanostructured TiN layer according to one embodiment of the present invention.
FIG. 7B is an SEM photograph top planar view of a cross-section of a nanostructured TiCN layer according to one embodiment of the present invention.
Figure 8:
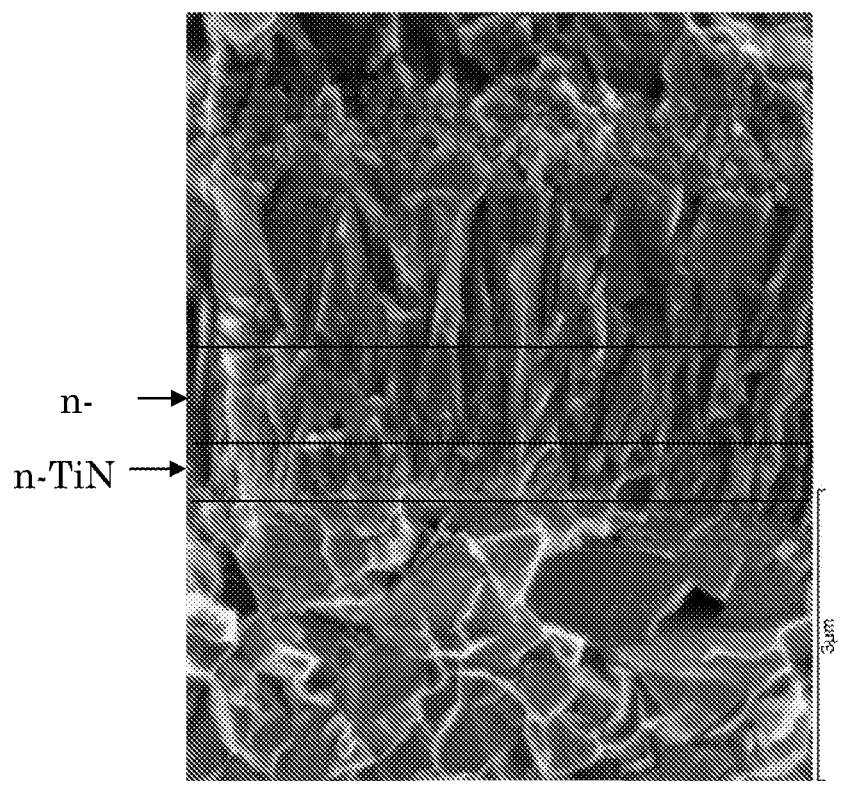
FIG. 8 is an SEM photograph side elevational view of a cross-section of a nanostructured layer according to one embodiment of the present invention.

For purposes herein, "nanostructured" may be defined as a layer that meets at least one of two different tests: a coating layer containing particles of an average size no greater than 100 nm (as used herein, "nano-sized" particles); or a coating layer with grains that are nano-sized in the X-Y plane (that is, parallel to the plane in which coatings are applied), but not necessarily nano-sized in the direction perpendicular to the plane in which the coatings are applied. In this second case of nanostructured, it may be understood then that nano-sized may encompass particles that are "grown" on a surface with a vertical dimension that is greater than 100 nm yet still be within the scope of the meaning of nanostructured. Non-nanostructured, as used herein, means not meeting any of the two different tests for nanostructured; in other words, non-nanostructured refers to a coating layer having particles of average size greater than 100 nm; and with grains measured in the X-Y plane having a size greater than 100 nm. FIG. 8 is an SEM photograph, taken in a direction parallel to the coating thickness, providing an example of this type of structure. FIG. 7A is a TEM image, taken in a direction perpendicular to the coating thickness, showing a TiN where the individual nano-sized grains are visible in the nanostructure.

Figure 9:
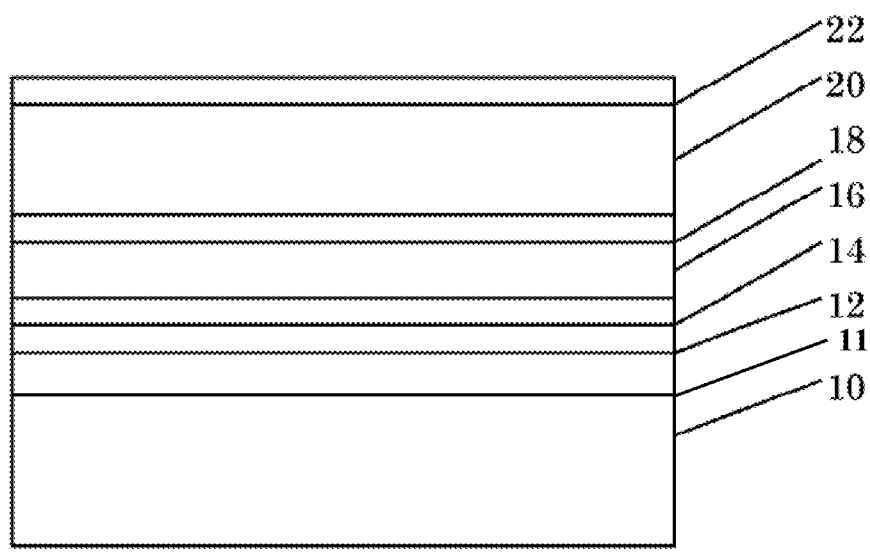
FIG. 9 is an illustration of one embodiment of the present invention, showing a number of nanostructured layers, the first being comprised of titanium.

In preferred embodiments, a non-nanostructured layer is deposited over the nanostructured layer to create a nanostructured-to-non-nanostructured interface. For example, a non-nanostructured aluminum oxide (a-$Al_2O_3$) layer 20 may be deposited over the nanostructured coating 30, as shown in FIG. 2. Other additional layers may be optionally deposited over the substrate (as shown in FIGS. 3 and 9), the functional aspects of each of the optional additional layers described more fully below.

As noted above, nanostructured coating 30 may be a single layer or a series of individual layers. The following description of individual layers 11, 12, 14, and 16 describe the preferred embodiments of those layers where the nanostructured coating 30 comprises a series of individual layers.

Layer 11 is preferably a layer of relatively pure titanium with a thickness in the range of 20 to 80 nm. This pure titanium layer provides the wettability to the substrate to enhance the adhesion of coating layers to the substrate. Further, the pure titanium layer helps to seal the substrate surface to prevent binder (in most cases, Co) from loss due to heat.

Layer 12 is preferably a nanostructured layer of titanium nitride (TiN) with a thickness typically in the range of about 0.5 to 1.0 microns, with average grain size (measured on a plane perpendicular to the coating thickness) that is less than about 100 nm. Layer 12 could be as thin as 0.2 microns. It is believed that TiN layer 12 at this thickness provides a good interfacial layer because of its affinity for the material of substrate 10 or the Ti-layer 11. While the preferred embodiment involves a non-composite layer 12 composed of only TiN, alternative embodiments may include a composite of different materials, in some cases including TiN in the composite, in layer 12.

Layer 14 is preferably a nanostructured layer of titanium carbonitride (TiCN) with a thickness typically in the range of about 0.5 to 1.0 microns. Layer 14 could be as thin as 0.3 microns. This layer 14 has a grain size (measured on a plane perpendicular to the coating thickness) of less than about 100 nm. As with layer 12, it may be noted that the layer's grain size is not limited to nanoscale size when measured on a plane parallel to the coating thickness, and the result may thus be "long" grains that extend vertically in the direction of the coating thickness. FIG. 7B is a TEM image, taken in a direction perpendicular to the coating thickness, showing a TiCN layer according to one embodiment, where the individual nano-sized grains are visible in the nanostructure. It is believed that thin TiCN layer 14 provides desirable properties because it provides a grain-size match to the material of layer 12, thereby providing a minimum of stress at the point of the connection between these two layers, and providing a good transition to the next outer layer.

Layer 16 is preferably a second nanostructured layer of TiCN, with a thickness of about 2.0 to 3.0 microns. Layer 16 could be as thin as 1.0 microns. Again, it may be noted that the layer's grain size is not limited to nanoscale size when measured on a plane parallel to the coating thickness, and the result may thus be "long" grains that extend vertically in the direction of the coating thickness.

As noted above, in one embodiment one or more additional optional layers may be further deposited over the substrate for various functional requirements, as needed. The following descriptions of layers 18 and 22 provide examples of the preferred embodiments of various optional additional layers. It is understood that these optional additional layers may be implemented whether the nanostructured coating 30 is a single nanostructured layer or a series of individual nanostructured layers. Furthermore, it is understood that one additional optional layer may be utilized, multiple optional layers may be utilized in combination (as shown in FIG. 3 for example), or no optional layers may be utilized. Layer 18 is preferably a layer of carbon-enriched TiCN with a thickness of about 0.1 to 0.6 microns, more preferably 0.2 to 0.3 microns. The carbon-enriched layer is a high-temperature $TiC_xN_y$ layer, where $X>1.0$, and $N<=1.0$ and maybe nanostructured or non-nanostructured. If deposited directly over the nanostructured coating 30, a nanostructured-to-non-nanostructured interface is created. Layer 22 is an optional capping layer, preferably comprising TiN, with a thickness of less than about 2.0 microns.

Finally, as noted above, a non-nanostructured layer 20 is preferably deposited over either the nanostructured coating 30 or if included, over the carbon-enriched layer 18. If deposited directly over the nanostructured coating 30, a nanostructured-to-non-nanostructured interface is created. Layer 20 is preferably a layer of aluminum oxide ($Al_2O_3$), with a thickness of about 3.0 to 4.0 microns. This material is desirable as a thermal barrier to the substrate and lower coating layers on the insert.

Figure 6:
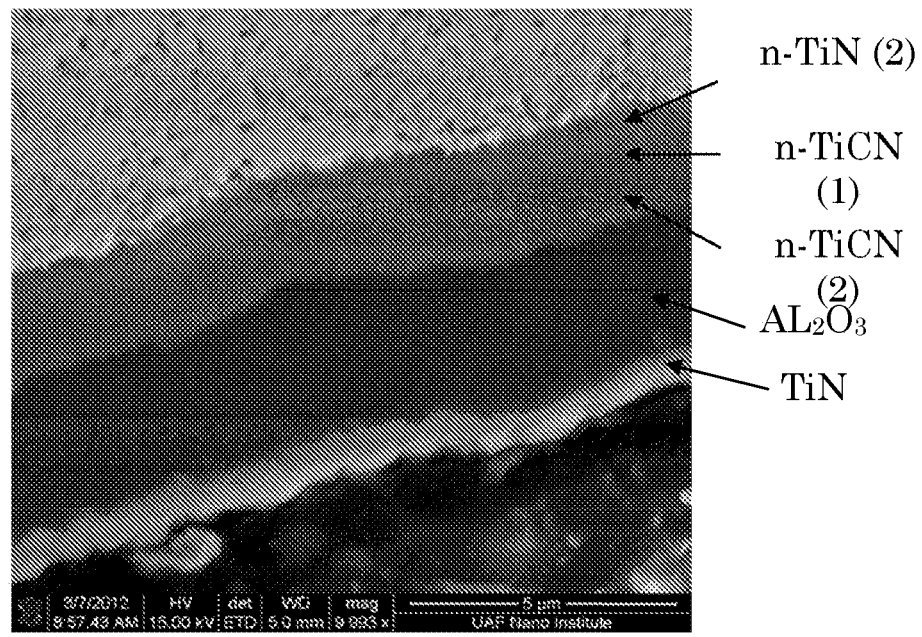
FIG. 6 is an SEM photograph at a side elevational view of a cross-section of multiple coatings according to one embodiment of the present invention.

In the preferred embodiment, the substrate coating (the nanostructured coating and non-nanostructured coating, including any sub-layers of those coatings, in combination) has a total thickness in the range of about 5 to 15 microns, but preferably is between 5 to 13 microns thick. For example, in one embodiment implementing a nanostructured coating of individual nanostructured layers 11, 12, 14, and 16 in addition to non-nanostructured layer 20, and additional optional additional layers 18 and 22, the overall thickness of these six coatings, taken together, is preferably about 5 to 10 microns. FIG. 6 is an SEM photograph in cross-section showing an example of these layers, with the breaks between material layers clearly visible. The ordering of layers is reversed from FIG. 3. It should be noted that although FIGS. 1-3 do not depict this aspect of the preferred embodiment, for the sake of clarity the coating layers in commercial embodiments should preferably extend over the edges of substrate 10.

The most preferred embodiment is present in FIG. 9. The embodiment presented in FIG. 9 differs from that presented in FIG. 3 in that a relatively pure Ti-layer 11 has been deposited over the substrate 10, and below the TiN-layer 12. As shown in FIG. 11, and consistent with the embodiment described in the schematic provided as FIG. 9, a coating with a total thickness of about 5 to 7 microns (2.5 to 3.5 micron of which is nanostructured) was applied on well-polished calo carbide samples with about 5 to 6% Co (binder). One of the calo sample was deposited with a Ti-layer (identical to the coating disclosed here), and the other one without the Ti-layer. A diamond indenter with an inclusive angle of 120 degree is used for scratch testing at 10 kg static loading. As shown in FIG. 11, the sample with Ti-layer FIG. 11A) showed excellent adhesion with both the substrate 10 and the adjacent nanostructured layer 12, while the one without Ti-layer showed coating delamination at the outlet of the scratch (FIG. 11.B). Whereas it has been demonstrated herein that a nanostructured-to-nanostructured interface significantly improves coating adhesion between coating layers, it has been further found that use of a high purity platinum nanostructure layer further improves adhesion when compared to other titanium alloys (such as TiCN).

Figure 12A:
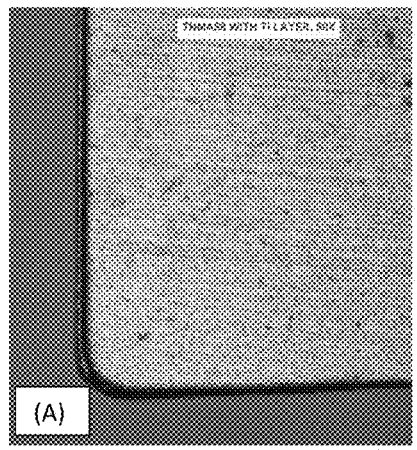
FIG. 12A is a second optical image showing the coating with a titanium layer in a second sample comparison.
Figure 12B:
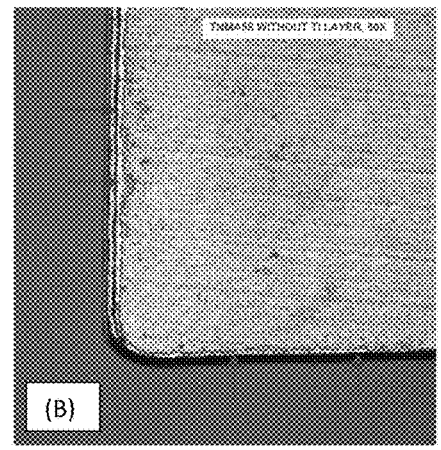
FIG. 12B is a second optical image showing the coating without a titanium layer in a second sample comparison.

Further considering the embodiment presented in FIG. 9, in a second example, a nanostructured coating layer thickness of about 7 to 10 microns (2.5 to 3.5 micron of which is nanostructured) applied on grinded TNMA58 inserts with about 7 to 9% Co (binder). [Insert nomenclature is standardized by ANSI. For further information see https://www.ctemag.com/news/articles/understanding-identification-system-indexable-inserts.] One TNMA58 insert was first deposited with a Ti-Layer (identical to the coating disclosed here), while the other one without the Ti-layer. The coated inserts are subjected to an abrasive post-treatment process with abrasive medium with particle size ranging from 10 to 150 microns, and more preferably from 30-80 microns under identical conditions (abrasive medium pressure of 2.0 bars and 3 minutes). As shown in FIG. 12, inserts with Ti-layer demonstrated an integrated coating on the edge (no delamination, FIG. 12.A), while the inserts without Ti-layer showed coating delamination on the edge (pointed by arrows, FIG. 12.B).

Figure 13A:
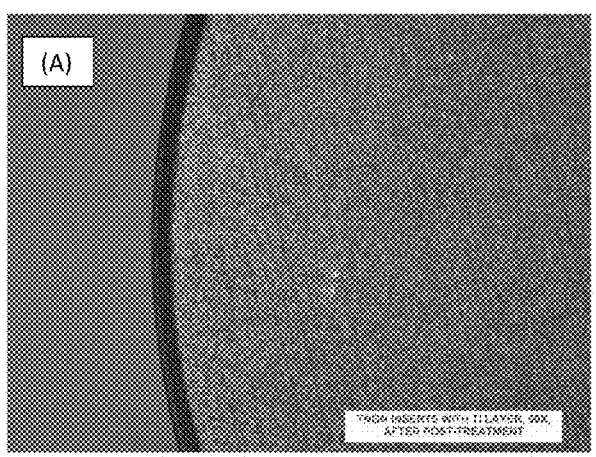
FIG. 13A is a third optical image showing the coating with a titanium layer in a third sample comparison.
Figure 13B:
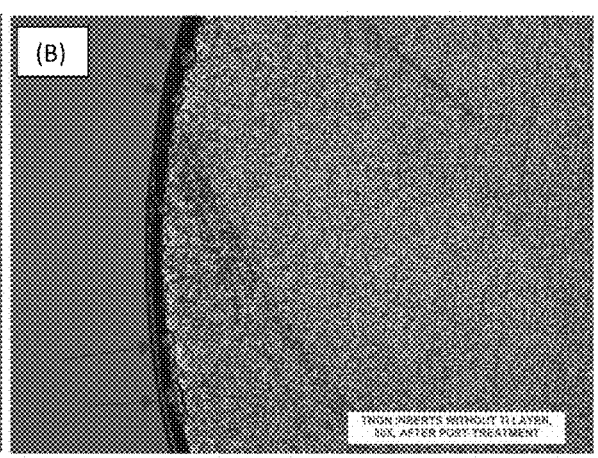
FIG. 13B is a third optical image showing the coating without a titanium layer in a third sample comparison.

Further considering the embodiment presented in FIG. 9, in a third example, a coating layer thickness of about 10 to 14 microns (5.5 to 9.5 micron of which is nanostructured) applied on grinded TNGN436 inserts with about 10% Co (binder). One TNGN436 insert was first deposited with a Ti-Layer (identical to the coating disclosed here), while the other one without the Ti-layer. The coated inserts are subjected to an abrasive post-treatment process with abrasive grit size of 28.8 to 58 microns under identical conditions (abrasive medium pressure of 2.0 bars and 3 minutes). As shown in FIG. 13, inserts with Ti-layer demonstrated an integrated coating on the edge (no delamination, FIG. 13.A), while the inserts without Ti-layer showed coating delamination on the edge (pointed by arrows, FIG. 13.B).

With respect to the preferred embodiment, grain size for the nanostructured layers as described above was performed using transmission electron microscopy (TEM) analysis, as is well understood in the art. Very thin samples (about 0.2 microns in thickness) were prepared with focused ion beam (FIB) methods. As may be seen in FIGS. 7A and 7B, average grain size is less than 100 nm for the nanostructured TiN and TiCN layers; the bar in the figures represents 50 nm. Again, the grain size was measured in the plane perpendicular to coating thickness, and thus the grain size in the plane parallel to coating thickness may be longer, as illustrated, for example, in FIG. 8, where the bar at the right of the figure represents 3 microns.

As indicated above, in one embodiment a post-treatment is applied to the nanostructured coated substrate described above. The method of application of the post-treatment is described in detail below. The post-treatment comprises a mixture of water and post-treatment abrasive medium with particle size ranging from 0.2 micron to 50 microns and preferably from 5 microns to 20 microns. Suitable abrasive mediums include oxides and carbides with the preferred abrasive medium being aluminum oxides. The post-treatment mixture contains 5 to 50 percent (weight percent) of abrasive medium, and more preferably 20 to 40 weight percent abrasive medium. The pressure of the post-treatment mixture ranges from 20 to 120 psi and more preferably from 40 to 80 psi.

The structure of a preferred embodiment of the present invention having now been presented, the preferred method for producing this structure may now be described. As noted above, the substrate 10 may be pre-treated with a mixture of compressed dry air and abrasive medium with particle size ranging from 10 to 150 micron, and more preferably from 30 to 80 micron. For this pre-treatment process, the substrates are loaded onto a planetary rotational stage with ten self-rotational poles. The rotational speed preferably ranges from 0.5 to 60 rpm. This pre-treatment process serves as an edge honing process for the substrate. The pre-treated substrate surface has a surface roughness (RMS) ranging from 0.05 to 1.5 micron and the honed edge has a radius ranging from 1.0 to 45 micron, and more preferably from 10 to 35 micron. Following this pre-treatment process, the multi-layer coating process occurs.

Nanostructured coating 30 is deposited using chemical vapor deposition techniques using a grain-refining agent. In the event multiple nanostructured layers are implemented in nanostructured coating 30, Ti-layer 11 and TiN layer 12 is deposited using chemical vapor deposition (CVD) techniques using a grain-refining agent. The process is performed at a medium reactor temperature, specifically about 850° C. to about 920° C. in the preferred embodiment. Ti-layer 11 uses temperature and reactants to control deposition. In particular, the refining agent in the preferred embodiment of TiN layer 12 is hydrogen chloride gas (HCl). It should be noted that HCl is generally seen as undesirable in CVD processes, since it tends to etch away or pit material that is being deposited, and thus slows the process of deposition. By slowing the process, it increases the cost of producing coated tool inserts. It has been found by the inventors, however, that HCl may be used to selectively etch or pit the layer as the deposition process moves forward in order to create nanostructured material. It is believed that the etching or pitting results in nucleation sites, that function to build nanostructure as the layer is deposited. The result, therefore, is a nanostructured layer of material that is produced at a relatively high rate of speed compared to what would be required to produce a similar layer without the refining agent. At this medium-temperature level, the grains produced are columnar, and thus within the definition of nanostructured as presented above.

Nanostructured TiCN layer 14 is also deposited using CVD techniques using the addition of HCl to produce a nanostructured layer. A medium-temperature process is employed, with a reactor temperature in this case of about 885° C. and reactor pressure of about 60 mbar. The second nanostructured TiCN layer 16 is applied at the same temperature, and again with added HCl, at a pressure of about 90 mbar. The TiCN with carbon enrichment layer 18 is deposited using a regular CVD process (no HCl added), at a higher temperature of about 1010° C. and reactor pressure of about 100 mbar.

$Al_2O_3$ layer 20 is deposited at a temperature of about 1005° to 1015° C. It may be noted that while certain references, such as U.S. Patent Publication No. 2006/0204757 to Ljungberg, teach that the $Al_2O_3$ layer desirably may be smoothed or fine-grained, it has been found by the inventors hereof that contrary to this teaching, roughness on this layer is not a detriment to the performance of the insert. For this reason, the inventors have been able to dramatically speed up the deposition process for this material as compared to prior art techniques, since slower deposition is required if a smooth finish is desired. In particular, the method of the preferred embodiment involves a deposition time for this $Al_2O_3$ layer of about 210 minutes, compared to a typical time of deposition of a comparably sized $Al_2O_3$ layer in prior art techniques (where a smooth surface is achieved) of about 4 hours. The TiN capping layer 22 is then deposited on top in a conventional CVD process.

The table below provides a summary of process parameters and precursors for layers deposited on substrate 10.

| Coating | $H_2$ | $N_2$ | HCl | $TiCl_4$ | $CH_3CN$ | $CH_4$ | $CO_2$ | $H_2S$ | Temp (° C.) | Pressure (mbar) | Duration (min) |
|---|---|---|---|---|---|---|---|---|---|---|---|
| η-TiN | 54.3% | 34.3% | 4.67% | 7.63% | | | | | 930 | 160 | 60 |
| η-TiCN | 54.5% | 31.1% | 4.67% | 9.34% | balanced | | | | 885 | 60 | 60 |
| η-TiCN | 54.5% | 31.1% | 4.67% | 9.34% | balanced | | | | 885 | 90 | 180 |
| TiCN with carbon enriched layer | 82.87% | 5.53% | | balanced | | 3.31% | | | 1010 | 100 | 30 |
| $Al_2O_3$ | 87.46% | | 8.81% | | | | 3.4% | balanced | 1015 | 60 | 210 |
| TiN | 63.16% | 26.31% | | balanced | | | | | 1015 | 100 | 30 |

The table below provides a summary of the deposition conditions for the Ti-layer 11.

| $H_2$, SLPM | $TiCl_4$ ml/min | Temp (° C.) | Duration (min) |
|---|---|---|---|
| 14 | 1.0 | 920 | 10 |

The insert may be finished for cutting by the use of edge preparation techniques as known in the art, including grinding, wire brushing, or similar processes. Alternatively, the coated substrate may be post-treated following the coating process prior to being finished for cutting. As noted above, the insert surfaces may be post-treated with a mixture of water and abrasive medium having particle size ranging from 0.2 to 50 microns, and more preferably from 5 to 20 microns. The abrasive medium may include oxides and carbides and preferably consists of aluminum oxides. During the post-treatment process, the inserts are loaded onto rotational stages driven by a chain and motor such that the rotational speed is between 1 and 50 rpm. The resulting post-treated surface preferably has a surface roughness (RMS) ranging from 0.05 to 0.5 microns. Substrates that have been pre-treated, coated, and post-treated according to the method described herein are suitable for machining and may include nickel-cobalt alloys, titanium alloys, stainless steels, and steels. These inserts are also suitable for cutting operations including turning, grooving, threading, and index milling. While the multi-layer coating process as described herein results in cutting tool inserts with enhanced wear resistance and usage life, the addition of the pre-treatment and post-treatment is believed to increase the wear resistant and usage capabilities of the cutting tools even further. Examples of these results may be found with regard to the non-limiting examples provided below.

Example 1

In this case study, two cutting tool inserts were compared using semi-finish OD turning of rings of Inconel 718 alloys. The first insert was an RPGN-3V carbide grade (C2) substrate with up sharp edge in uncoated form. The second insert was a RPGN-3V carbide insert with a multiple-layer nanostructured coating according to the present invention. The nanostructured coating (TM20) comprised the following layered coating: TiN—TiCN(1)-TiCN(2)-a-$Al_2O_3$ with the first three layers in nanostructured form and the additional alumina layer in non-nanostructured form. The total thickness of the coating layer was 5-9 pm. The second insert comprised an edge hone of 10-20 μm. The tools were used at a surface speed of 200-225 SFM, a feed rate of 0.012 IPR, and a depth of cut of 0.01". The failure criteria selected were 0.25 mm flank wear and surface quality (surface finish and waviness) of workpiece quantified using surface profilometer and acoustic method. The results show a drastic increase in tool life for the cutting tool coated according to the present invention: 7-8 minutes of tool life for the non-coated substrate and a 30 minute tool life for the coated carbide substrate according to the present invention.

Example 2

In this case study, two cutting tool inserts were compared using OD turning of a low-pressure turbine case made of aged 718 alloys. The first insert was a CVD coated RCMT43 S05F carbide grade (C2) substrate with an edge hone of 25-35 μm. The second insert was an RCMT43 TS2020 carbide insert with a multiple-layer nanostructured coating according to the present invention, where the substrate comprised a micron-grain carbide substrate with hardness of 92.4 and cobalt binder percentage of 6.1%. The nanostructured coating (applied by CVD) comprised the following layered coating in sequence: TiN—TiCN(1)-TiCN(2)-a-$Al_2O_3$ with the first three layers in nanostructured form and the alumina layer in non-nanostructured form. The total thickness of the coating layer was 9 to 13 μm. The second insert comprised an edge hone of 12-25 μm. The tools were used at a surface speed of 180 SFM, a feed rate of 0.012 IPR, and a depth cut of 0.04". The failure criteria selected were 0.25 mm flank wear and surface finish. The results show an increase in tool life for the cutting tool coated according to the present invention: 100 min tool life for the regular CVD coated substrate and 144 min tool life for the multi-layer coating according to the present invention.

Example 3

Cutting tests were performed in connection with a target material of American Iron and Steel Institute (AISI) 4340 hardened steel with severe interruptions. The inserts used for testing were CNMA432 carbide turning inserts, coated with nanostructured coatings in multi-layered form (individual nanostructured layers 12, 14, and 16) and with additional layers 18, 20, and 22 as described above. A benchmark test was performed using the same type of insert (same style and grade) coated with conventional coating techniques with similar chemistry but micron-sized grains in each of the coating layers. The workpiece used was a material with a diameter of 6.0", with four deep, V-shaped slots in the peripherals to provide interruptions for testing, along with four ⅜" diameter through-holes evenly distributed on the end surface. Machining conditions were as follows:
    Surface speed: 400 SFM
    Feed rate: 0.004 IPR
    Depth of cut: 0.01"
    Dry/wet: with cutting fluid
    Failure criteria: 0.008" flank wear or 0.004" crater wear
    With these test parameters and workpiece specifications as set out above, the benchmark insert demonstrated a tool life before failure, on average, of about 7 minutes. The insert prepared according to the preferred embodiment of the present invention, as previously described, produced an average tool life before failure of about 20 minutes. It may be seen therefore that the invention produced markedly improved performance over prior art coating techniques for cutting tool inserts, particularly when used in connection with the cutting of hardened steel with severe interruptions, which is known in the art as a particularly difficult material with respect to cutting tool insert life. The preferred embodiment may also find particular application where impact resistance is desired in a cutting tool insert.

The inventors believe that the combination of nanostructured layers with other layers that are not nanostructured may be responsible for the dramatically improved performance of the preferred embodiment. The matching of nanostructured and non-nanostructured materials may produce a unique combinatorial architecture delivering dramatically improved results, achieving a cutting tool insert that is less prone to chip-off failure and flank wear problems. Nanostructured-to-nanostructured interface significantly increases contact area and further improves coating adhesion between coating layers. The transition from inner layers to outer layers of smaller-scaled to larger-scaled particles may create a better bond between the layers of the coating and between the coating and the substrate. This structure may also result in fewer stress points—or may compensate for stress points that result from material discontinuities/defects—within the structure of the substrate/coating matrix. The presence of stress points within the coating structure are believed by the inventors hereof to correlate with premature wear or failure.

Example 4

This example shows the performance enhancements obtained by pre- and post-treatment of the coated substrates. RPGN-3V inserts were used at the following conditions for semi-finishing and finishing Ti-17 alloys.
    Surface speed: 200 to 225 SFM
    Feed rate: 0.012 IPR
    Depth of cut: 0.01" (per side)
    At identical tool failure criteria of 0.012" flank wear and workpiece surface finish of 12 RMS, multi-layer coated RPGN-3V TM2005 substrates with submicron grain size, 6.0% cobalt, hardness of 92.8 HRA and total thickness of 7.0 to 9.0 microns, which were pre-treated and post-treated to obtain a surface roughness of 0.5 micron, produced tool life of about 20 minutes, whereas other products of identical geometry, RPGN-3V, from top OEMs produced only 7 to 8 minutes of tool life.

Example 5

Again, this example shows the performance enhancements obtained by pre and post treatment of substrates. RPGN-3V inserts were used at the following conditions for semi-finishing and finishing 718 inconel alloys (with hardness of more than 40 HRC):
Surface speed: 200 to 225 SFM
Feed rate: 0.012 IPR
Depth of cut: 0.01" (per side)

At identical tool failure criteria of 0.012" flank wear and workpiece surface finish of 12 RMS, multi-layer coated RPGN-3V TM2005 substrates with submicron grain size, 6.0% cobalt, hardness of 92.8 HRA and total thickness of 7.0 to 9.0 microns, which were pre-treated and post-treated to obtain a surface roughness of 0.5 micron, produced tool life of about 30 minutes, whereas other products of identical geometry, RPGN-3V, from top OEMs produced only 7 to 8 minutes of tool life.

Example 6

In this case study, two cutting tool inserts, with and without the first relatively pure Ti-layer were compared. Both inserts were prepared with the same coating for pre-hardened steel machining with the same coating thickness (13 to 14 microns) with Ti-layer (A) and without Ti-layer (B) in turning AISI 4140 alloy steels. Workpiece materials were AISI 4140 alloy steel bars with hardness of 24 to 25 HRC. Inserts were CNMG432 MR (chip break geometry) P15 (substrate grade for specifically for steel machining).
Surface speed: 725 SFM
Feed rate: 0.0004 IPR
Depth of cut: 0.01" (per side)
Failure criteria: flank wear of 0.012"

With these test parameters and workpiece specifications as set out above, the insert without the Ti-layer demonstrated a tool life before failure, on average of 11.5 minutes. The insert prepared with the Ti-layer demonstrated a tool life before failure, on average of 14.8 minutes. Clearly, coating with Ti-layer enhances tool life due to improved adhesion. Based on the multiple testing, in average, tool life for coating with Ti-layer in turning pre-hardened steel using identical inserts and same workpiece materials is 29% longer than that from coating with Ti-layer.

These examples show that a substrate coated with nano-structured coating, especially where the first nanostructured layer consists of a relatively pure titanium layer, and optional additional coating layers not only improves tool performance, but that pre-treatment and post-treatment of these substrates delivers performance enhancement for inserts used in turning titanium alloys and nickel-cobalt alloys. This same performance enhancement may be recognized in machining using stainless steels and steels among others.

I claim:
1. A cutting tool insert, comprising:
 a. a carbide substrate with a hardness range of 90 to 93 HRA comprising an average tungsten carbide grain size of 0.4 to 0.8 microns, a honing edge in the range of 10 and 35 microns, and a surface roughness of 0.05 to 1.5 micron;
 b. at least one nanostructured layer, wherein a first at least one nanostructured layer is deposited over the substrate, and if applicable, followed by depositing a series of at least one nanostructured layers, one at a time, over a prior at least one nanostructured layer until application of a final at least one nanostructured layer resulting in a nanostructured coating, wherein each at least one nanostructured layer is selected from a group consisting of titanium, titanium carbonitride, titanium carbide, and titanium nitride;
 c. a carbon enriched layer deposited over an outer surface of the final at least one nanostructured layer wherein the carbon enriched layer comprises a carbon enriched layer of titanium carbonitride;
 d. a non-nanostructured layer deposited over the carbon enriched layer wherein the non-nanostructured layer comprises an aluminum oxide layer with a surface roughness ranging from 0.05 to 0.5 microns.

2. The cutting tool insert of claim 1, wherein the first nanostructured layer comprises a thickness in the range of about 0.02 to about 0.08 microns, further wherein the first nanostructured layer consists essentially of titanium.

3. The cutting tool insert of claim 2, wherein the nanostructured coating further comprises a second nanostructured layer deposited over the first nanostructured layer, wherein the second nanostructured layer comprises a thickness in the range of about 0.5 to about 1.0 microns, further wherein the second nanostructured layer consists essentially of titanium nitride.

4. The cutting tool insert of claim 3, wherein the nanostructured coating further comprises a third nanostructured layer deposited over the second nanostructured layer, wherein the third nanostructured layer comprises a thickness in the range of about 0.5 to about 1.0 microns, further wherein the third nanostructured layer consists essentially of titanium carbonitride.

5. The cutting tool insert of claim 4, wherein the nanostructured coating further comprises a fourth nanostructured layer deposited over the third nanostructured layer, wherein the fourth nanostructured layer comprises a thickness in the range of about 2.0 to about 3.0 microns, further wherein the fourth nanostructured layer consists essentially of titanium carbonitride.

6. A cutting tool insert, comprising:
 a. a carbide substrate with an average tungsten carbide grain size of 0.4 to 0.8 microns, a honing edge in the range of 10 and 35 microns, and a surface roughness of 0.5 to 1.5 micron;
 b. a nanostructured coating deposited over the substrate, the nanostructured coating comprising
  i. a first nanostructured layer deposited over the substrate; and
  ii. a second nanostructured layer deposited over the first nanostructured layer;
  iii. a third nanostructured layer deposited over the second nanostructured layer;
  iv. a fourth nanostructured layer deposited over the third nanostructured layer;
 c. a carbon enriched layer deposited over the fourth nanostructured layer wherein the carbon enriched layer comprises a carbon enriched layer of titanium carbonitride;
 d. a non-nanostructured layer deposited over the carbon enriched layer wherein the non-nanostructured layer comprises an aluminum oxide layer with a surface roughness ranging from 0.05 to 0.5 microns;

e. a nanostructured-to-non-nanostructured interface at a face of the non-nanostructured layer in contact with the nanostructured layer, thereby forming a coated substrate.

7. The cutting tool insert of claim 6, wherein the first nanostructured layer consists of titanium with a thickness in the range of about 0.02 to about 0.08 microns.

8. The cutting tool insert of claim 7, wherein the second nanostructured layer consists of titanium nitride.

9. The cutting tool insert of claim 8, wherein the third nanostructured layer consists of titanium carbonitride.

10. The cutting tool insert of claim 9, wherein the fourth nanostructured layer consists of titanium carbonitride.

11. The cutting tool insert of claim 10, further comprising a capping layer over the aluminum oxide layer.

12. The cutting tool insert of claim 11, wherein a total thickness of the four nanostructured layers on the substrate is 3.0 to 5.0 microns.

13. The cutting tool insert of claim 11, wherein a total thickness of the four nanostructured layers on the substrate is 2.5 to 3.5 microns.

14. A cutting tool insert, comprising:
   a. a carbide substrate with an average tungsten carbide grain size of 0.4 to 0.8 microns, a honing edge in the range of 10 and 35 microns, and a surface roughness of 0.05 to 1.5 micron;
   b. a coating deposited over the substrate, the coating comprising
      v. a titanium layer deposited over the substrate; and
      vi. a first nanostructured layer deposited over the titanium layer;
      vii. a second nanostructured layer deposited over the first nanostructured layer;
      viii. a third nanostructured layer deposited over the second nanostructured layer;
   c. a carbon enriched layer deposited over the third nanostructured layer wherein the carbon enriched layer comprises a carbon enriched layer of titanium carbonitride;
   d. a non-nanostructured layer deposited over the carbon enriched layer wherein the non-nanostructured layer comprises an aluminum oxide layer with a surface roughness ranging from 0.05 to 0.5 microns;
   e. a nanostructured-to-non-nanostructured interface at a face of the non-nanostructured layer in contact with the nanostructured layer, thereby forming a coated substrate.

15. The cutting tool insert of claim 14, wherein the titanium layer comprises a thickness of 0.005 to 0.150 microns.

16. The cutting tool insert of claim 15, wherein the first nanostructured layer consists of titanium nitride.

17. The cutting tool insert of claim 16, wherein the second nanostructured layer consists of titanium carbonitride.

18. The cutting tool insert of claim 17, wherein the third nanostructured layer consists of titanium carbonitride.

19. The cutting tool insert of claim 18, further comprising a capping layer over the aluminum oxide layer.

20. The cutting tool insert of claim 19, wherein a total thickness of the four nanostructured layers on the substrate is 3.0 to 5.0 microns.

21. The cutting tool insert of claim 19, wherein a total thickness of the four nanostructured layers on the substrate is 2.5 to 3.5 microns.

* * * * *